US012784823B2

(12) United States Patent
Lee et al.

(10) Patent No.: US 12,784,823 B2
(45) Date of Patent: Nov. 3, 2026

(54) BIT LINE CHARGE SHARING FOR SRAM DYNAMIC POWER SAVINGS

(71) Applicant: QUALCOMM Incorporated, San Diego, CA (US)

(72) Inventors: Hochul Lee, Los Angeles, CA (US); Anil Chowdary Kota, San Diego, CA (US); Chulmin Jung, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 142 days.

(21) Appl. No.: 18/823,460

(22) Filed: Sep. 3, 2024

(65) Prior Publication Data

US 2026/0065979 A1 Mar. 5, 2026

(51) Int. Cl.
*G11C 16/04* (2006.01)
*G11C 11/412* (2006.01)
*G11C 11/419* (2006.01)

(52) U.S. Cl.
CPC .......... *G11C 11/419* (2013.01); *G11C 11/412* (2013.01)

(58) Field of Classification Search
CPC ............................ G11C 11/419; G11C 11/412
See application file for complete search history.

(56) References Cited

U.S. PATENT DOCUMENTS 6,785,179 B1 * 8/2004 Bull .......................... G11C 7/12 365/154
9,824,749 B1 11/2017 Nautiyal et al.
10,410,715 B2 * 9/2019 Sinangil ................ G11C 11/419
2014/0036581 A1 2/2014 Agarwal et al.
2015/0380079 A1 * 12/2015 Agarwal ............... G11C 11/419 365/156

OTHER PUBLICATIONS

International Search Report and Written Opinion PCT/US2025/042836 ISA/EPO Dec. 2, 2025.

* cited by examiner

*Primary Examiner* — Pho M Luu
(74) *Attorney, Agent, or Firm* — Loza & Loza, LLP

(57) ABSTRACT

A bit line charge sharing precharge circuit is provided that precharges a bit line pair during a charge sharing period in which the bit line pair is isolated from a memory power supply voltage. Prior to the charge sharing period, one of the bit lines in the bit line pair was charged to the memory power supply voltage whereas a remaining one was either fully or partially discharged. Charge thus flows from the charged bit line to the discharge bit line during the charge sharing period to precharge the bit lines for a current read or write operation.

20 Claims, 8 Drawing Sheets

BIT LINE CHARGE SHARING FOR SRAM DYNAMIC POWER SAVINGS

TECHNICAL FIELD

The present application relates generally to memories and more specifically, to static random-access memories (SRAMs) with bit line charge sharing.

BACKGROUND

The bitcells in an SRAM arranged into banks with each bank having its own rows and columns. A corresponding pair of bit lines traverses each column whereas a corresponding word line traverses each row of bitcells. Adjacent ones of the bit lines are separated by a bit line pitch. As the transistor size has decreased, the bit line pitch has decreased accordingly. This reduced bit line pitch typically prevents the memory designer from implementing a sense amplifier within the bit line pitch for a column to sense the bit line pair during a read operation. The columns are thus arranged into global input/output (GIO) groups with the columns within a GIO being selected by a corresponding column multiplexer during a read or write operation. For example, in a multiplexer 2 (MUX2) SRAM, each GIO corresponds to two columns within a bank. Prior to a read or write operation, a precharge circuit precharges the bit lines to a memory power supply voltage.

SUMMARY

In accordance with an aspect of the disclosure, a bit line charge sharing precharge circuit is provided that includes: a bit line; a complement bit line; a first switch coupled between the bit line and complement bit line; a power supply node for a memory power supply voltage; a precharge node; a second switch coupled between the precharge node and the power supply node; and a third switch coupled between the precharge node and the complement bit line.

In accordance with another aspect of the disclosure, a method of precharging a pair of bit lines is provided that includes: coupling a precharge node to a node for a memory power supply voltage during a first precharge period to precharge the precharge node; isolating the precharge node from the node for the memory power supply voltage after a completion of the first precharge period; coupling a bit line to a complement bit line during a charge sharing period following the completion of the first precharge period; and coupling the precharge node to the bit line and to the complement bit line during the charge sharing period.

Finally, in accordance with yet another aspect of the disclosure, a memory is provided that includes: a bit line; a complement bit line; precharge means for precharging a precharge node during a precharge period; and means for coupling the bit line to the complement bit line and to the precharge node during a charge sharing period following the precharge period.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Prior to a read or write operation, all the bit lines for a bank are typically precharged to the memory power supply voltage. In a read or write operation, a column multiplexer then selects for a selected-one of the columns in its GIO. Depending upon the binary value of the bit being written to or read from the selected column, one of the bit lines in a pair of bit lines for the selected column will be discharged towards ground. The bitcells for a selected row that intersect with the unselected columns in the GIO will also discharge bit lines in the unselected column while the word line is asserted depending upon each bitcell's stored binary value.

Figure 1:
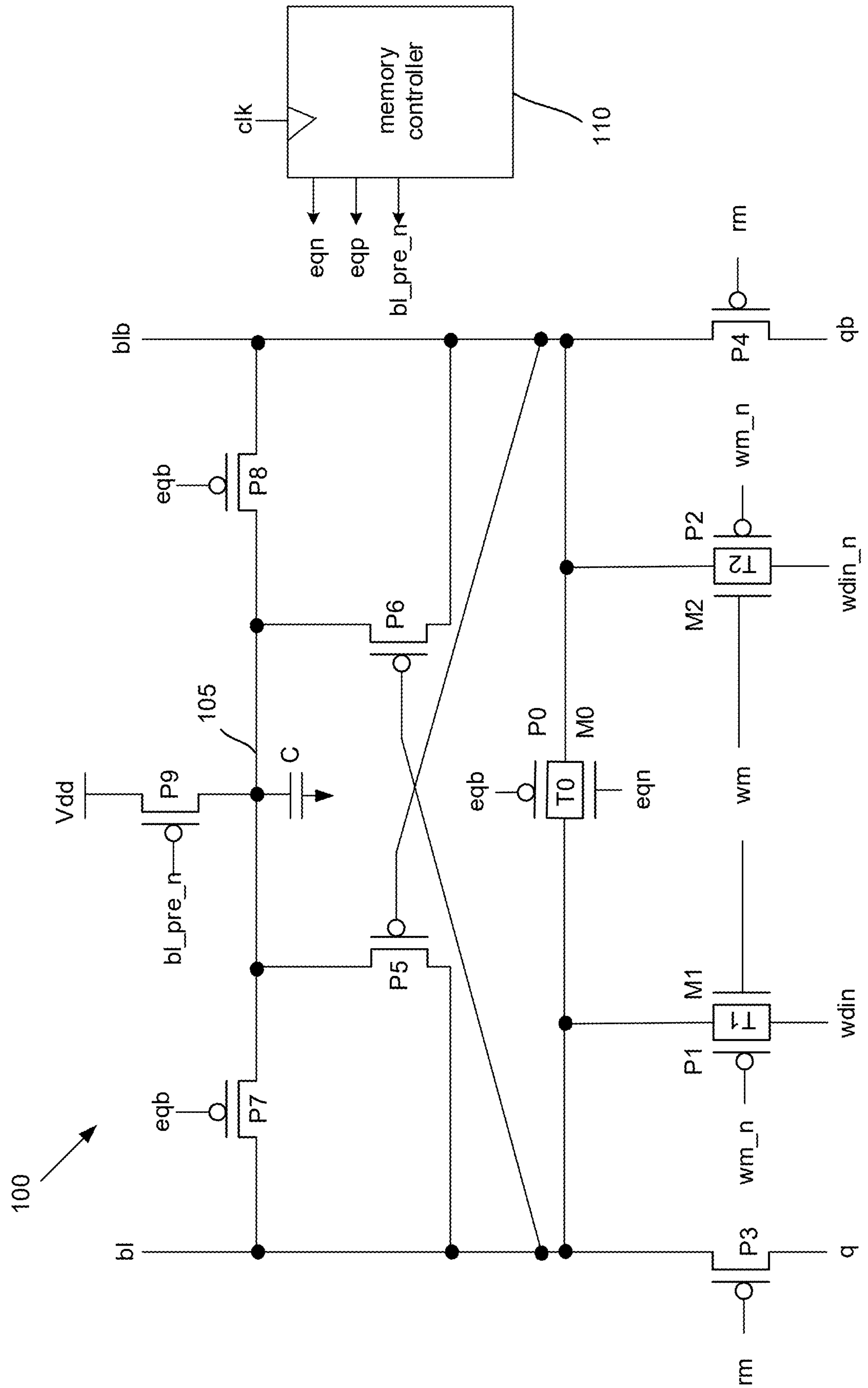
FIG. 1 illustrates a first bit line charge sharing precharge circuit in accordance with an aspect of the disclosure.

The charge conducted to ground for both the selected column and the unselected columns during a read or write operation consume a substantial amount of power. An SRAM is disclosed herein that reduces this power consumption through a charge sharing precharge circuit that reduces the precharge voltage of the bit lines. An example charge sharing precharge circuit 100 for a pair of bit lines including a bit line bl and a complement bit line blb is shown in FIG. 1. The pair of bit lines traverse a column of bitcells (not illustrated) as will be further explained herein. Following either a read or a write operation, one of the bit lines (either the bit line bl or the complement bit line blb) in the bit line pair will be charged to a memory power supply voltage Vdd whereas a remaining one of bit lines in the bit line pair will be fully or partially discharged to ground. To save power for the bit line precharge for a current read or write operation, the charge sharing precharge circuit 100 functions to share the charge from the charged one of the bit lines with the discharged one of the bit lines. This charge sharing occurs in a charge sharing period prior to the assertion of the word line (not illustrated) for the read or write operation.

To conduct charge from the charged bit line to the discharged bit line, the bit line bl couples to the complement bit line blb through a switch such as a transmission gate T0 formed by a parallel combination of a p-type metal-oxide semiconductor (PMOS) transistor P0 and an n-type metal-oxide semiconductor (NMOS) transistor M0. The transmission gate T0 is also denoted herein as a first switch. An active-high charge sharing signal eqn that is asserted during the charge sharing period drives a gate of the transistor N0. Similarly, an active-low charge sharing signal eqb that is the complement of the charge sharing signal eqn drives a gate of the transistor P0. As defined herein, a binary signal such as either of the charge sharing signals eqn and eqb is deemed to be asserted when that binary signal is true, regardless of whether an active-high or an active-low convention is used. With respect to the active-low charge sharing signal eqb, it is thus asserted by being discharged during the charge sharing period. Conversely, the charge sharing signal eqn is asserted by being charged to a memory power supply voltage Vdd during the charge sharing period since is it is an active-high signal. A memory controller 110 such as synchronized by a system clock clk asserts the charge sharing signals eqn and eqb during the charge sharing period that occurs just prior to the word line assertion for the current read or write operation as will be further explained herein.

With the charge sharing signals eqn and eqb being asserted during the charge sharing period, charge from the charged one of the bit lines conducts through the transmission gate T0 to the discharged one of the bit lines. Each of the bit lines in the bit line pair has substantially the same capacitance as the remaining bit line. The charge sharing through the transmission gate T0 during the charge sharing period could thus result in each of the bit lines being precharged to one half of the memory power supply voltage Vdd. For example, suppose that due to a previous read or write operation, the bit line bl was charged to the memory power supply voltage Vdd whereas the complement bit line blb was discharged to ground. In the charge sharing period for a current read or write operation, the voltage of the bit line bl would drop from the memory power supply voltage Vdd to one-half of the memory power supply voltage Vdd. Conversely, the voltage of the complement bit line blb would rise from ground (or a partial discharge to ground) to one-half of the memory power supply voltage Vdd.

Precharging the bit lines to just one-half of the memory power supply voltage Vdd instead of the traditional full rail precharging to Vdd saves substantial power. In contrast, suppose that a traditional precharging circuit coupled to a power supply node for a reduced power supply voltage were used to precharge the bit lines to the reduced power supply voltage. But this no-charge-sharing precharging would then require a voltage source such as a power management integrated circuit (PMIC) to manage the reduced power supply voltage. The bitcells themselves would still require the full rail memory power supply voltage Vdd, which result in the memory having the expense of two separate power supply voltages (Vdd and a reduced version of Vdd). In contrast, the charge sharing precharge circuit 100 avoids this expense yet saves substantial power.

Although dropping the bit line precharge voltage to just one-half of the power supply voltage Vdd saves power, such a reduced bit line precharge voltage may cause an unacceptable static noise margin (SNM) for the memory depending upon the magnitude of the memory power supply voltage Vdd. To increase the SNM, the charge sharing precharge circuit 100 may also include a precharge node 105 that is precharged to the power supply voltage Vdd during a bit line precharge period prior to the charge sharing period. A PMOS transistor P9 has a source coupled to a power supply node for the memory power supply voltage Vdd and a drain coupled to the precharge node 105. An active-low bit line precharge signal bl_pre_n such as controlled by the memory controller 110 couples to the gate of the transistor P9 to control the transistor P9 to be one during the precharge period and to be off otherwise. To do so, the memory controller 110 asserts the bit line precharge signal bl_pre_n during the bit line precharge period. Since the bit line precharge signal bl_pre_n is an active-low signal, it is asserted by being discharged to ground, which causes the transistor P9 to conduct so that the precharge node 105 is charged to the memory power supply voltage Vdd. In a traditional precharge circuit, such a precharge would also be coupled to the bit lines to precharge the bit lines to the memory power supply voltage Vdd. But in the charge sharing precharge circuit 100, a PMOS transistor P7 that has a first drain/source terminal coupled to the precharge node 105 and second drain/source terminal coupled to the bit line bl as well as a PMOS transistor P8 that has a first drain/source terminal coupled to the precharge node 105 and a second drain/source terminal coupled to the complement bit line blb prevent this precharging. The term "drain/source terminal" is used because which terminal that acts as a source versus which terminal that acts as a drain depends upon the voltage state (charged or discharged) of the respective bit line after the previous read or write operation.

To control whether the transistors P7 and P8 are conducting or off, the charge sharing signal eqb drives their gates. Recall that the memory controller 110 asserts the (active-low) charge sharing signal eqb only during the charge sharing period and that the bit line precharge signal bl_pre_n is asserted only during the precharge period. The precharge node 105 will thus be precharged to the memory power supply voltage Vdd during the precharge period and will then float with respect to the power supply node during the charge sharing period. But the charge on the precharge node 105 will then be available to further precharge the bit lines during the charge sharing period since the transistors P7 and P8 will conduct during the charge sharing period. This additional charge will then boost the precharged state of the bit lines above the Vdd/2 level that would otherwise result if the transmission gate T0 were used without any further precharging. The amount of boosting depends upon the capacitance of the precharge node. In some implementations, the capacitance of the precharge node 105 itself is sufficient to provide the desired precharge boosting of the bit lines. This capacitance depends upon the implementation of the precharge node 105. With respect to this implementation, the active devices for the charge sharing precharge circuit 100 such as the transistors P7, P8, and P9 and also the transmission gate T0 may be integrated into a semiconductor die for the integrated circuit (not illustrated) that includes the corresponding memory. The bit lines and the precharge node 105 may then be formed through a patterning of one or more metal layers adjacent the semiconductor die to form leads. Depending upon how many metal layers are patterned and the width and length of the leads determines the bit line and the precharge node 105 capacitances.

In other implementations, the capacitance of the precharge node 105 is not sufficient to provide the desired boost or increase to the precharged voltage of the bit lines. A capacitor C may thus be used that couples between the precharge node 105 and ground to increase the capacitance of the precharge node 105. For example, suppose that a combined capacitance of the precharge node 105 and the capacitor C is one-half the capacitance of each of the bit lines. The additional charge from the precharge node 105 during the charge sharing period will then boost the bit line precharge from one-half to approximately 60% of the memory power supply voltage Vdd. Such a precharge saves substantial power for a subsequent read or write operation as compared to precharging the bit lines to 100% of the memory power supply voltage Vdd for the subsequent read or write operation, yet the SNM is still sufficiently high to provide a desired level of performance. Transistor P7 is also denoted herein as a second switch. Similarly, transistor P8 is also denoted herein as a third switch. The transistor P9 may also be deemed herein to form a means for precharging a precharge node during a precharge period. In addition, transistors P7, P8, and transmission gate T0 may be deemed to form a means for coupling the bit line bl to the complement bit line blb during a charge sharing period following the precharge period.

To select for the bit line bl during a current read operation, a column multiplexer includes a read multiplexer PMOS transistor P3 having a first source/drain terminal coupled to a sense amplifier q node for a sense amplifier (not illustrated) and having a second source/drain terminal coupled to the bit line bl. Similarly, the column multiplexer includes a read multiplexer PMOS transistor P4 having a first source/drain terminal coupled to a complement sense amplifier qb node for the sense amplifier and having a second source/drain terminal coupled to the complement bit line blb. An active-low read multiplexer signal rm drives the gates of the read multiplexer transistors P3 and P4 to control whether they conduct or not. A sense amplifier precharge circuit (not illustrated) such as controlled by the memory controller 110 precharges the sense amplifier q and qb nodes by asserting a sense enable precharge signal during a sense amplifier node precharge period as will be explained further herein. The sense amplifier q and qb nodes then float during the charge sharing period for the current read operation. Should the bit lines be selected for the current read operation, an address decoder (not illustrated) asserts the read multiplexer signal rm during the charge sharing period and also during a word line assertion period for the current read operation. The precharged and floating sense amplifier q and qb nodes will thus assist in the precharging of the bit lines during the charge sharing period should the bit lines be selected. Conversely, no charge from the q and qb nodes will assist in the precharging of the bit lines during a current read operation if the bit lines are not selected for the current read operation.

A similar boost in the precharge of the bit lines occurs during a current write operation if the bit lines are selected. To perform the selection of the bit line bl during the current write operation, the column multiplexer includes a transmission gate T1 that couples between a write driver data input (wdin) node and the bit line bl. The transmission gate T1 is formed by a parallel combination of a PMOS transistor P1 and an NMOS transistor M1. An active-high write multiplexer signal wm drives the gate of the transistor M1 and an active-low write multiplexer signal wm_n drives the gate of the transistor P1 to control whether the transmission gate T1 is open or shut. Similarly, the column multiplexer includes a transmission gate T2 coupled between a complement write driver input node wdin_n and the complement bit line blb for performing the selection of the complement bit line blb. The transmission gate T2 is formed by a parallel combination of a PMOS transistor P2 and an NMOS transistor M2. The active-high write multiplexer signal wm drives the gate of the transistor M2 whereas the active-low write multiplexer signal wm_n drives the gate of the transistor P2 to control whether the transmission gate T2 is open or shut.

The write driver input node wdin and the complement write driver input node wdin_n are precharged to Vdd during the precharge period and then float during the charge sharing period for the current write operation. Charge from the wdin and wdin_n nodes may thus assist in the precharging of the bit lines during the charge sharing period if the bit lines are selected during a current write operation. Conversely, no charge from the wdin and wdin_n nodes will assist in the precharging of the bit lines during a current write operation if the bit lines are not selected for the current write operation.

Regardless of whether the bit line pair is selected for a current read or write operation, the bit line pair is precharged to a fraction of the memory power supply voltage Vdd through the charge sharing. The current read or write operation will then discharge one of the bit lines and charge the remaining one of the bit lines to the memory power supply voltage Vdd if the bit line pair is selected. But if the bit line pair is not selected, one of the bit lines will be discharged towards ground depending upon the binary content of the accessed bitcell whereas the remaining bit one of the bit lines will not be charged back to the memory power supply voltage Vdd. Recall that the charge sharing presupposes that one of the bit lines is charged to the memory power supply voltage Vdd and that a remaining one of the bit lines is discharged partially or fully to ground. To ensure that this complementary precharged state is achieved for both the selected and unselected bit line pairs, a pair of cross-coupled PMOS transistors P5 and P6 couple between the precharge node 105 and the bit lines. In particular, the transistor P5 has a source coupled to the precharge node 105, a drain coupled to the bit line bl, and a gate coupled to the complement bit line blb. Similarly, the transistor P6 has a source coupled to the precharge node 105, a drain coupled to the complement bit line blb, and a gate coupled to the bit line bl. Should the assertion of the word line in the current read or write operation cause the bit line bl to be discharged more than the complement bit line blb, the transistor P6 is switched on so that the precharge node 105 is coupled to the complement bit line blb. Following the completion of the current read or write operation, the precharge period begins for the subsequent read or write operation, which causes the precharge node 105 to be charged to the memory power supply voltage Vdd. In turn, the switching on of the transistor P6 causes the complement bit line blb to be fully precharged to the memory power supply voltage Vdd. This charging of the complement bit line blb forcers the transistor P5 to remain off, which forces the voltage of the bit line bl to remain unchanged from its state prior to the charging of the complement bit line blb.

Conversely, should the assertion of the word line in the current read or write operation cause the complement bit line blb to be discharged more than the bit line bl, the transistor P5 is switched on so that the precharge node 105 is coupled to the bit line bl. Following the completion of the current read or write operation, the precharge period begins for the subsequent read or write operation, which causes the precharge node 105 to be charged to the memory power supply voltage Vdd. In turn, the switching on of the transistor P5 causes the bit line bl to be fully precharged to the memory power supply voltage Vdd. This charging of the bit line bl forces the transistor P6 to remain off, which forces the voltage of the complement bit line blb to remain the same as it was prior to the charging of the bit line bl. In this fashion, the cross-coupled transistor P5 and P6 ensure that the desired complementary state for the bit line pair is achieved prior to the subsequent read or write operation (one of the bit lines being charged to the memory power supply voltage Vdd and the other bit line being grounded or partially discharged).

Figure 2:
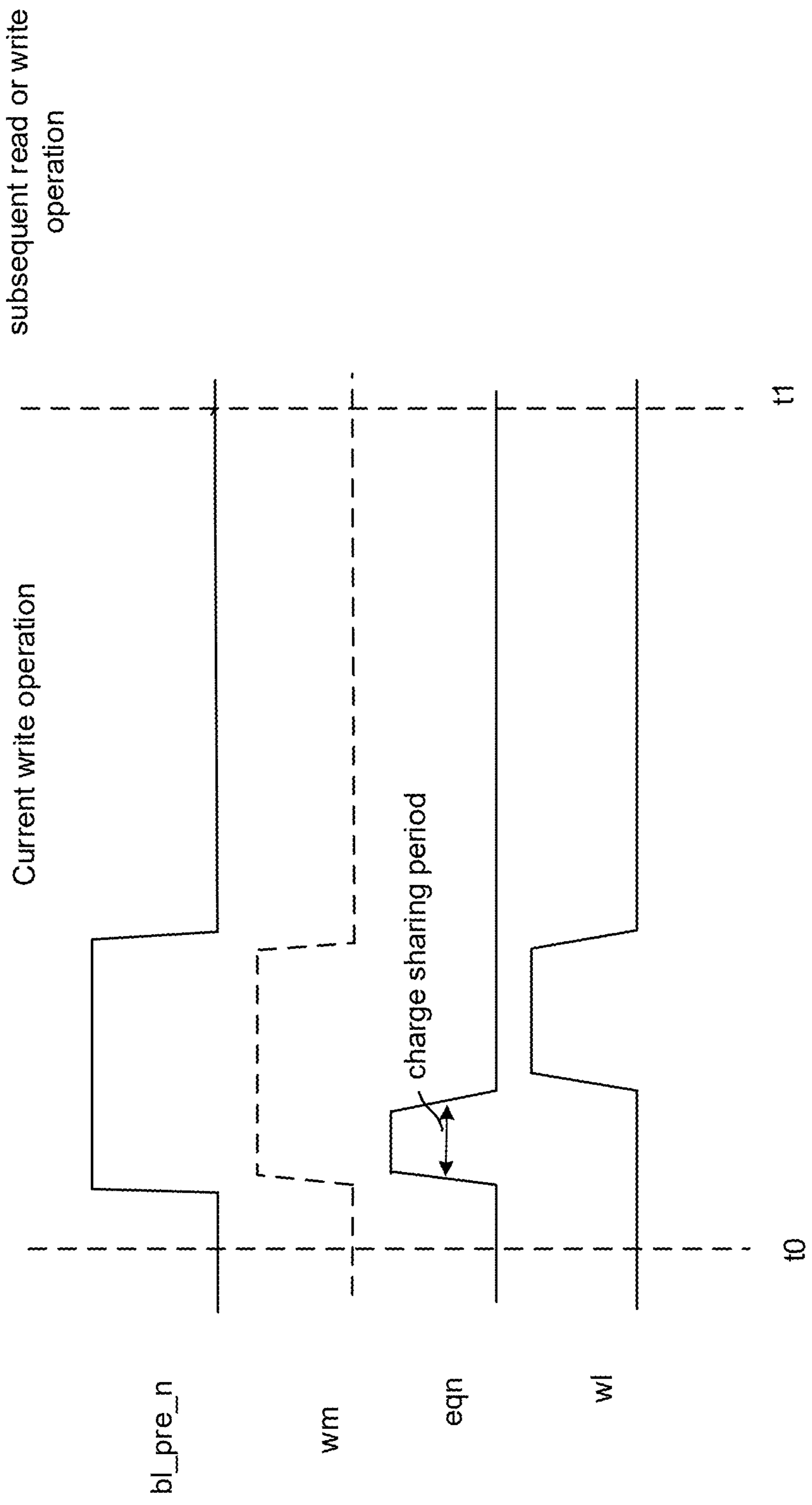
FIG. 2 illustrates some waveforms for the circuit of FIG. 1 during a current write operation in accordance with an aspect of the disclosure.

Some example waveforms for a current write operation are shown in FIG. 2. The current write operation begins at a time t0 followed by the end of the precharge period due to the de-assertion of the bit line precharge signal bl_pre_n (recall that this signal is an active-low signal, so it is de-asserted by being charged to the memory power supply voltage). At approximately the same time, the charge sharing period begins with the assertion of the charge sharing signal eqn. Should the bit line pair be selected, the write multiplexer signal wm is also asserted approximately at the beginning of the charge sharing period. The charge sharing period then ends with the de-assertion of the charge sharing signal eqn whereupon the word line wl is asserted for a word line assertion period. The word line assertion period ends approximately when the write multiplexer signal wm is de-asserted. At approximately the same time, the precharge period begins for the subsequent read or write operation at a time t1. Since the write multiplexer signal wm is not asserted if the bit line pair is not selected, the write multiplexer signal wm is shown in FIG. 2 using a dotted line. As discussed previously, the bit line pair is precharged to a fraction (e.g., 60 to 70%) of the memory power supply voltage Vdd during the charge sharing period. This fraction will be increased if the bit line pair is selected due to the additional charge sharing from the write driver input nodes wdin and wdin_n. The complement charge sharing signal eqb is not shown in FIG. 2 but would have a complementary behavior to that shown for the charge sharing signal eqn.

Figure 3:
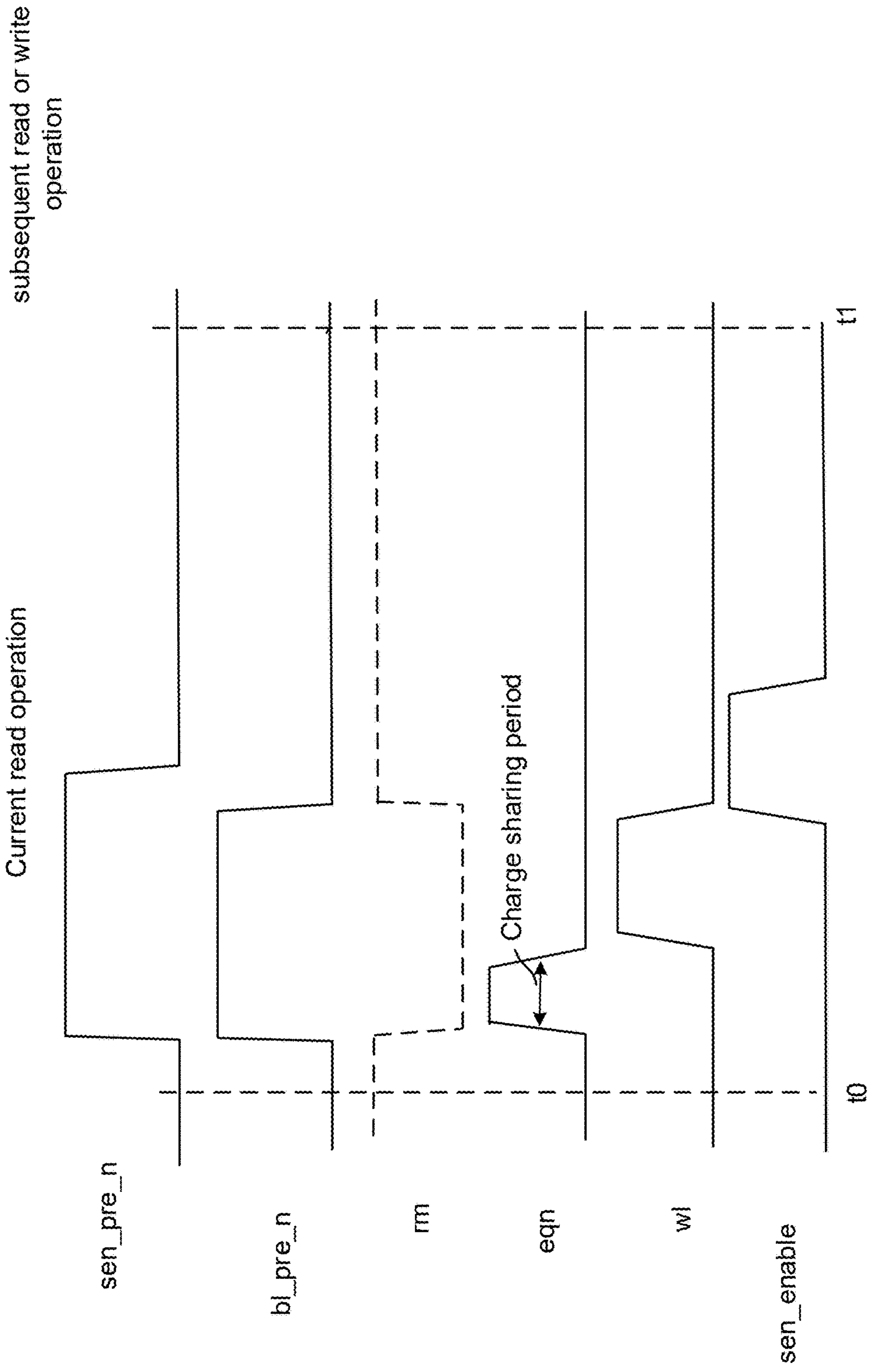
FIG. 3 illustrates some waveforms for the circuit of FIG. 1 during a current read operation in accordance with an aspect of the disclosure.

Some example waveforms for a current read operation are shown in FIG. 3. The current write operation begins at a time t0 followed by the end of the bit line precharge period due to the de-assertion of the bit line precharge signal bl_pre_n (recall that this signal is an active-low signal, so it is de-asserted by being charged to the memory power supply voltage). The precharge of the sense amplifier nodes q and qb during the sense amplifier node precharge period also ends at approximately the same time as the end of the bit line precharge period through a de-assertion of an active-low sense amplifier node precharge signal sen_pre_n. At approximately the same time as the end of the bit line and sense amplifier node precharge periods, the charge sharing period begins with the assertion of the charge sharing signal eqn. Should the bit line pair be selected, the read multiplexer signal rm is also asserted approximately at the beginning of the charge sharing period. The charge sharing period then ends with the de-assertion of the charge sharing signal eqn whereupon the word line wl is asserted for a word line assertion period. The word line assertion period ends approximately when the read multiplexer signal rm is de-asserted. At approximately the same time, the bit precharge period begins for a subsequent read or write operation at a time t1. Since the read multiplexer signal rm is not asserted if the bit line pair is not selected, the read multiplexer signal rm is shown in FIG. 3 using a dotted line. As discussed previously, the bit line pair is precharged to a fraction (e.g., 60 to 70%) of the memory power supply voltage Vdd during the charge sharing period. This fraction will be increased if the bit line pair is selected for the current read operation due to the additional charge sharing from the sense amplifier nodes q and qb. The complement charge sharing signal eqb is not shown in FIG. 3 but would have a complementary behavior to that shown for the charge sharing signal eqn. Slightly before the word line assertion ends, the sense amplifier is enabled through the assertion of a sense enable signal (sen_enable).

Figure 4:
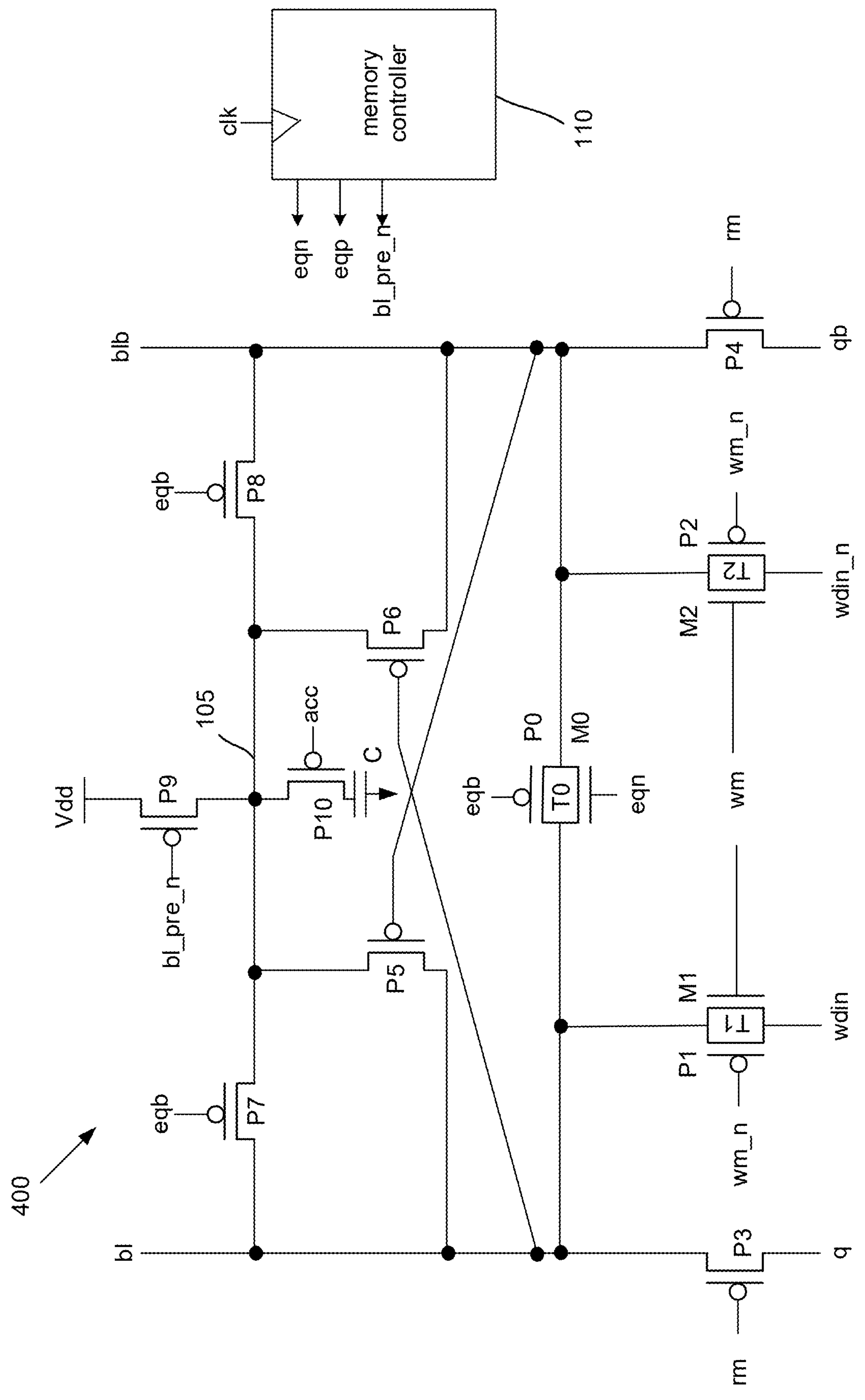
FIG. 4 illustrates a second bit line charge sharing precharge circuit in accordance with an aspect of the disclosure.

Referring again to the charge sharing precharge circuit 100 of FIG. 1, note that the precharge boost provided by the capacitor C may be unnecessary during a high-performance mode in which the memory power supply voltage Vdd is sufficiently elevated. To address this issue, a charge sharing precharge circuit 400 as shown in FIG. 4 is as described with respect to the charge sharing circuit 100 except that the charge sharing precharge circuit 400 includes a PMOS transistor P10 to function as a switch between the capacitor C and the precharge node 105. An active-low switch signal acc is asserted at the gate of the transistor P10 during the high-performance mode to isolate the capacitor C from the precharge node 105. In this fashion, charge from the capacitor C is prevented from being discharged during the current read or write operation to reduce the power consumption. In a low-power mode of operation in which the memory power supply voltage Vdd is reduced, the switch signal acc is de-asserted so that the capacitor C may function to boost the bit line precharge during the charge sharing period.

Figure 5:
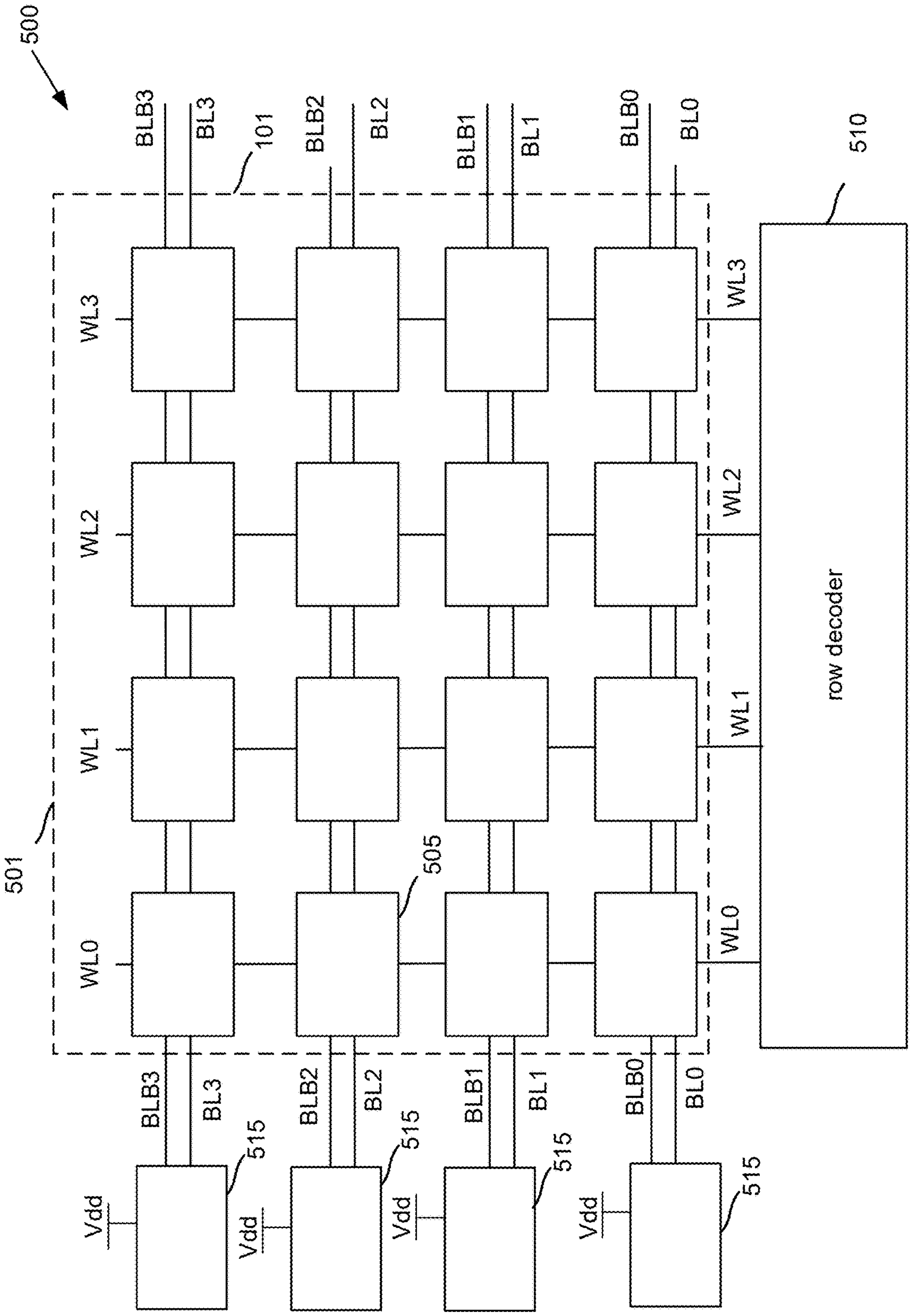
FIG. 5 illustrates a memory with charge sharing for bit line precharging in accordance with an aspect of the disclosure.

A MUX4 SRAM 500 with charge sharing is shown in FIG. 5. SRAM 500 includes a sub-array 501 of bitcells 505 for a corresponding bank in the SRAM 500. Sub-array 501 is arranged into four columns and four rows with a bitcell 505 at each column and row intersection. A corresponding pair of bit lines traverses each column. For example, a zeroth bit line (BL0) and a complement zeroth bit line (BLB0) extend across a zeroth column. Similarly, a first bit line (BL1) and a complement first bit line (BLB1) traverse a first column. In the same fashion, a second bit line (BL2) and a complement second bit line (BLB2) traverse a second column. Finally, a third bit line (BL3) and a complement third bit line (BLB3) extend across a third column. A corresponding word line traverses each row of bitcells 505 ranging from a zeroth word line WL0, a first word line WL1, a second word line WL2, to a third word line WL3. A row decoder 510 includes logic gates (not illustrated) to decode a row address to select from the word lines.

During a read or write operation, a column multiplexer (not illustrated) selects a pair of bit lines from the four columns. In a read operation, the selected bit lines are then coupled to a sense amplifier (not illustrated) so that a global output bit may be read. Similarly, the column multiplexer selects for a column's pair of bit lines during a write operation so that a global input bit may be written into a selected bitcell 505 through a write driver (not illustrated). Since the column multiplexer structure is generic for either a read or a write operation, the resulting global input or output signal may be referred to as a global input/output (GIO) signal. SRAM 500 is a multiplexer 4 (MUX4) memory in that four columns are selected from with respect to the corresponding GIO signal. Other column multiplexing implementations may be used such as MUX2 or MUX8 in alternative implementations. Prior to a read or write operation, each pair of bit lines is precharged by a corresponding charge sharing precharge circuit 515. Each charge sharing precharge circuit 515 may be implemented as discussed for either the precharge circuit 100 or the precharge circuit 400.

Figure 6:
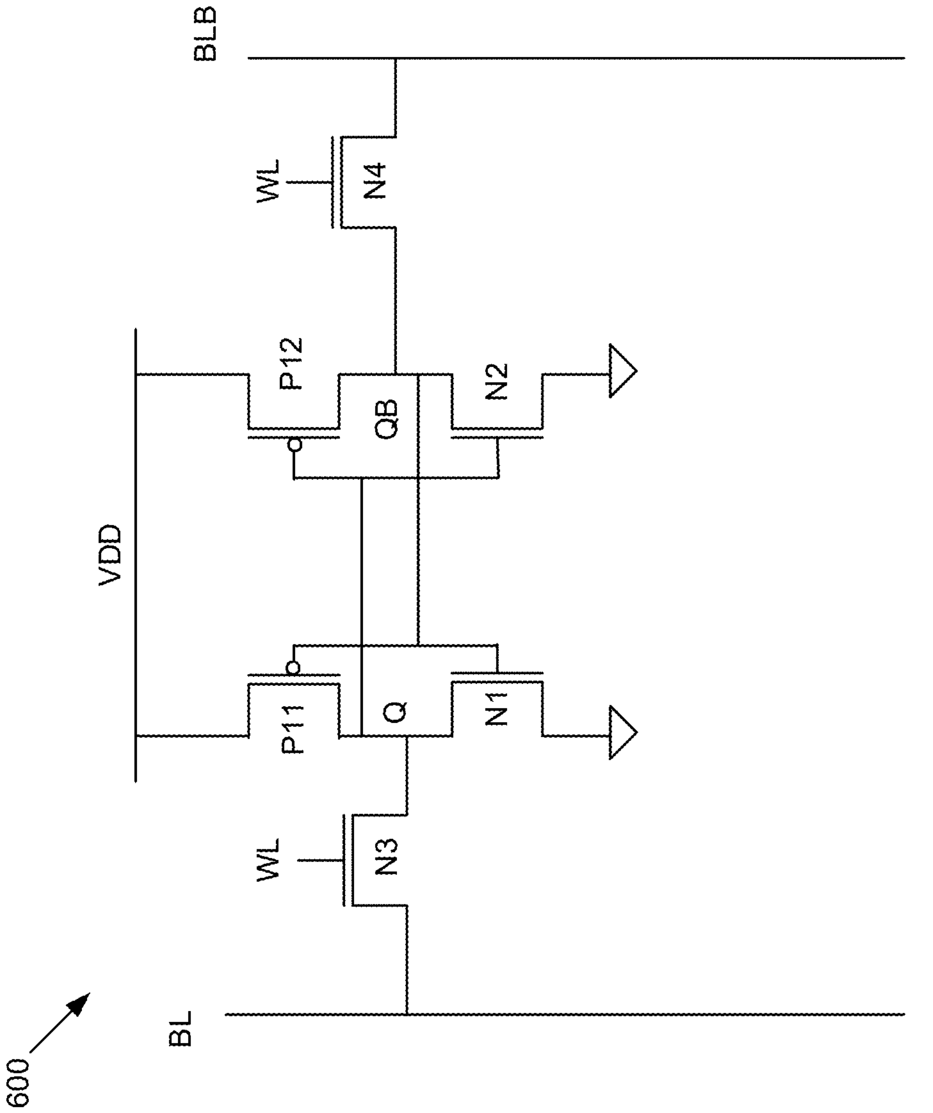
FIG. 6 is a circuit diagram of a bitcell in the memory of FIG. 5.

One of the bitcells 505 is shown in more detail in FIG. 6 as a bitcell 600. A bit line BL is a generic representation of one of the bit lines BL0 through BL3 discussed with respect to the memory 500. Similarly, a complement bit line BLB is a generic representation of one of the complement bit lines BLB0 through BLB3. The bitcell 600 includes a first inverter formed by a PMOS transistor P11 having a source coupled to a power supply node for a power supply voltage VDD and a drain coupled to a drain of an NMOS transistor N1 having a source coupled to ground. The drains of the transistors P11 and N1 support a Q bit signal that may couple through an NMOS access transistor N3 to drive the bit line BL. A word line (WL) that is a generic representation of one of the word lines WL0 through WL3 drives the gate of the access transistor N3 to control whether the Q bit signal may couple to the bit line BL. The Q bit signal also drives a gate of a PMOS transistor P12 and an NMOS transistor N2 forming a second inverter that is cross coupled with the first inverter. The source of the transistor P12 couples to the power supply node and its drain couples to a drain of the transistor N2 having a source coupled to ground. The drains of the transistors P12 and N2 support a QB complement bit signal that may couple through an NMOS access transistor N4 to drive the complement bit line. The word line WL drives the gate of the access transistor N4 to control whether the QB complement bit signal may couple to the complement bit line BLB.

Figure 7:
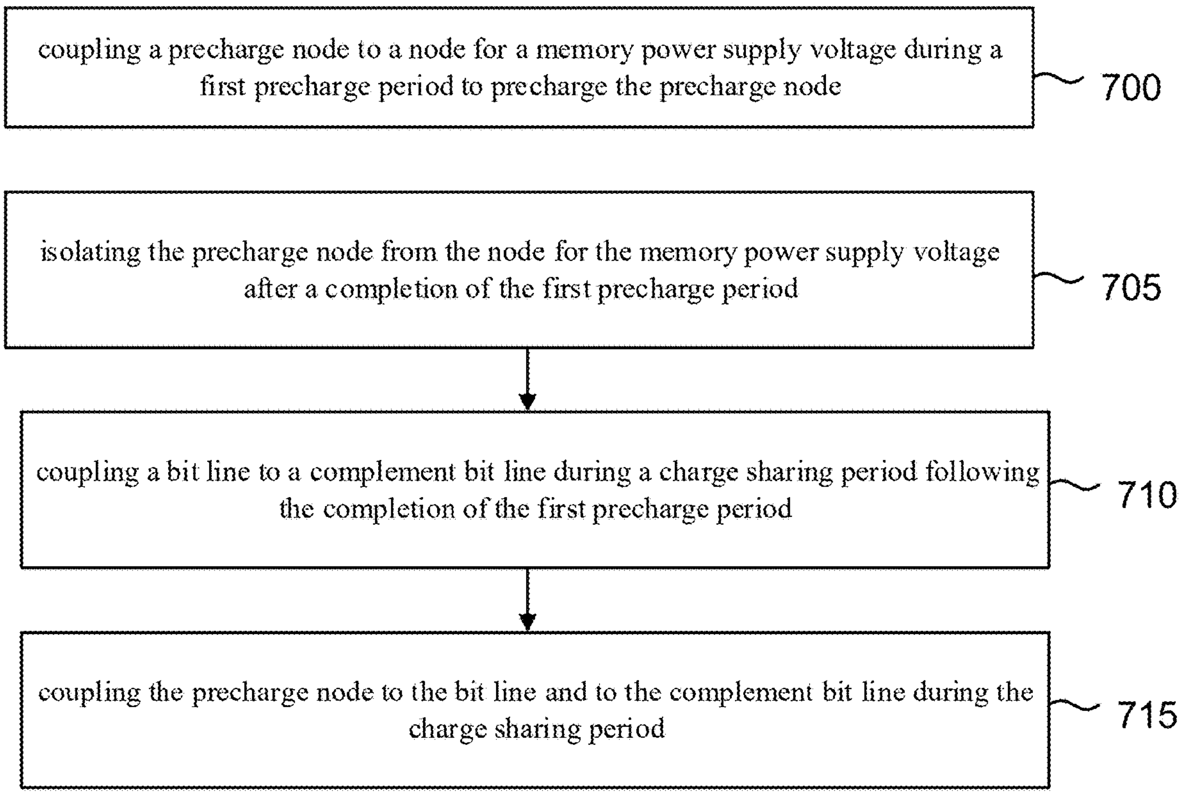
FIG. 7 is a flowchart for an example method of charge sharing for bit line precharging in accordance with an aspect of the disclosure.

An example charge sharing method will now be discussed with respect to the flowchart of FIG. 7. The method includes an act 700 of coupling a precharge node to a node for a memory power supply voltage during a first precharge period to precharge the precharge node. The switching on of the transistor P9 during the precharge period of either of FIG. 2 or 3 is an example of act 700. The method also includes an act 705 of isolating the precharge node from the node for the memory power supply voltage after a completion of the first precharge period. The switching off of the transistor P9 following the precharge period of either of FIG. 2 or 3 is an example of act 705. The method further includes an act 710 of coupling a bit line to a complement bit line during a charge sharing period following the completion of the first precharge period. The closing of the transmission gate T0 during the charge sharing period of either of FIG. 2 or 3 is an example of act 710. Finally, the method includes an act 715 of coupling the precharge node to the bit line and to the complement bit line during the charge sharing period. The switching on of the transistors P7 and P8 during the precharge period of either of FIG. 2 or 3 is an example of act 715.

Figure 8:
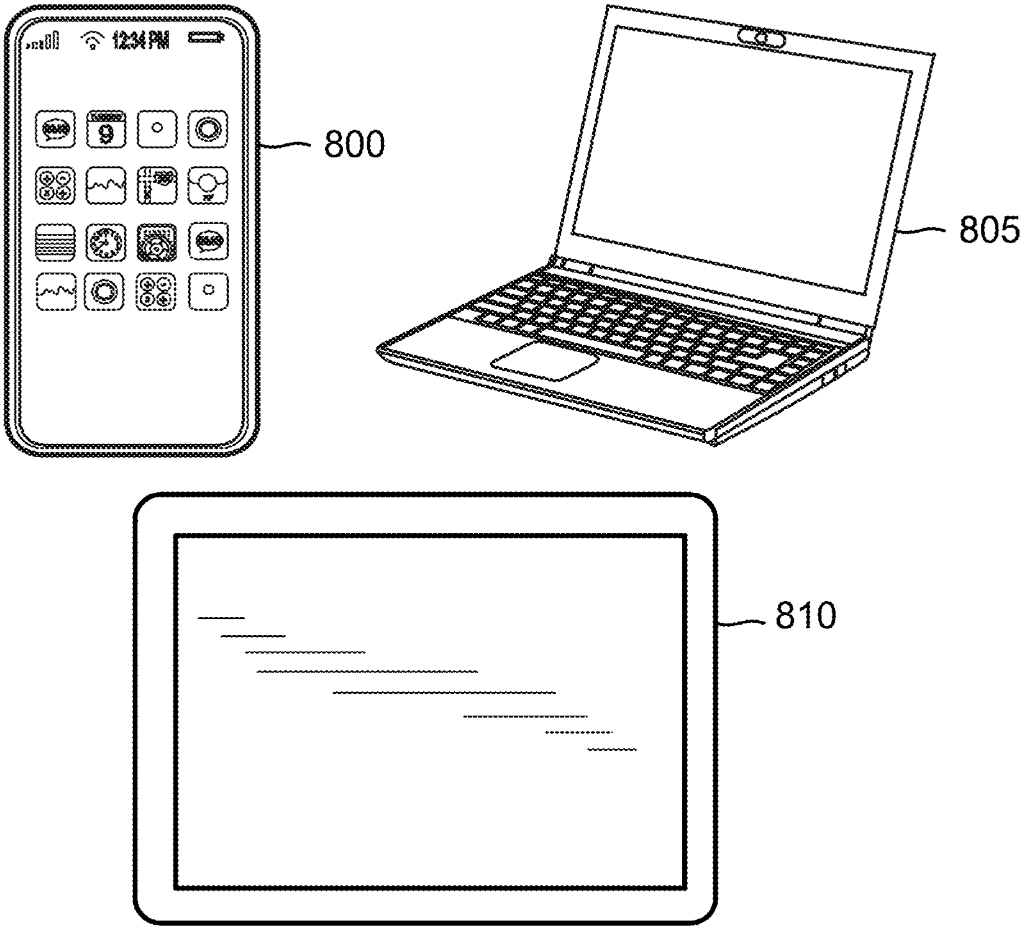
FIG. 8 illustrates some example electronic systems each including a memory including charge sharing for bit line precharging in accordance with an aspect of the disclosure.

A memory with bit line precharge sharing as disclosed herein may be incorporated in a wide variety of electronic systems. For example, as shown in FIG. 8, a cellular telephone 800, a laptop computer 805, and a tablet PC 810 may all include a memory in accordance with the disclosure. Other exemplary electronic systems such as an earbud, a music player, a video player, a communication device, and a personal computer may also be configured with a memory constructed in accordance with the disclosure.

Some example implementations will now be summarized through the following numbered clauses:

Clause 1. A bit line charge sharing precharge circuit, comprising:
- a bit line;
- a complement bit line
- a first switch coupled between the bit line and complement bit line;
- a power supply node for a memory power supply voltage;
- a precharge node;
- a second switch coupled between the precharge node and the power supply node; and
- a third switch coupled between the precharge node and the complement bit line.

Clause 2. The bit line charge sharing precharge circuit of clause 1, wherein the first switch comprises a first transmission gate.

Clause 3. The bit line charge sharing precharge circuit of any of clauses 1-2, wherein the second switch comprises a first p-type metal-oxide semiconductor (PMOS) transistor having a gate coupled to a node for a precharge sharing signal.

Clause 4. The bit line charge sharing precharge circuit of clause 3, wherein the third switch comprises a second PMOS transistor having a gate coupled to the node for the precharge sharing signal.

Clause 5. The bit line charge sharing precharge circuit of clause 4, further comprising:
- a third PMOS transistor coupled between the precharge node and the bit line and having a gate coupled to the complement bit line.

Clause 6. The bit line charge sharing precharge circuit of clause 5, further comprising:
- a fourth PMOS transistor coupled between the precharge node and the complement bit line and having a gate coupled to the bit line.

Clause 7. The bit line charge sharing precharge circuit of any of clauses 1-6, further comprising:
- a column multiplexer configured to select the bit line and the complement bit line from a group of bit line pairs during a read or write operation.

Clause 8. The bit line charge sharing precharge circuit of clause 7, wherein the column multiplexer comprises:
- a second transmission gate coupled between a node for a write driver input signal and the bit line; and
- a third transmission gate coupled between a node for a complement write driver input signal and the complement bit line, wherein the second transmission gate and the third transmission gate is each configured to open and close responsive to a column multiplexer signal.

Clause 9. The bit line charge sharing precharge circuit of clause 8, wherein the column multiplexer further comprises:
- a fifth PMOS transistor coupled between a sense amplifier node and the bit line and having a gate coupled to a node for a read multiplexer signal; and
- a sixth PMOS transistor coupled between a complement sense amplifier node and the complement bit line and having a gate coupled to the node for a read multiplexer signal.

Clause 10. The bit line charge sharing precharge circuit of any of clauses 1-9, further comprising:
- a memory controller configured to close the first switch during a charge sharing period and to close the second switch and the third switch during a precharge period.

Clause 11. The bit line charge sharing precharge circuit of any of clauses 1-10, further comprising:
- a capacitor coupled between the precharge node and ground.

Clause 12. The bit line charge sharing precharge circuit of clause 11, further comprising:
- a fourth switch coupled between the capacitor and the precharge node.

Clause 13. A method of precharging a pair of bit lines, comprising:
- coupling a precharge node to a node for a memory power supply voltage during a first precharge period to precharge the precharge node;
- isolating the precharge node from the node for the memory power supply voltage after a completion of the first precharge period;
- coupling a bit line to a complement bit line during a charge sharing period following the completion of the first precharge period; and
- coupling the precharge node to the bit line and to the complement bit line during the charge sharing period.

Clause 14. The method of clause 13, wherein coupling the bit line to the complement bit line during the charge sharing period comprises closing a transmission gate coupled between the bit line and the complement bit line.

Clause 15. The method of any of clauses 13-14, further comprising:

asserting a voltage of a word line for a word line assertion period to couple a bitcell to the bit line and to the complement bit line following a completion of the charge sharing period.

Clause 16. The method of clause 15, further comprising:

coupling the precharge node to the node for a memory power supply voltage during a second precharge period following a completion of the word line assertion period.

Clause 17. A memory, comprising:

a bit line;

a complement bit line;

precharge means for precharging a precharge node during a precharge period; and means for coupling the bit line to the complement bit line and to the precharge node during a charge sharing period following the precharge period.

Clause 18. The memory of clause 17, further comprising:

a first transistor coupled between the precharge node and the bit line and having a gate coupled to the complement bit line; and a second transistor coupled between the precharge node and the complement bit line and having a gate coupled to the bit line.

Clause 19. The memory of any of clauses 17-18, further comprising:

a capacitor coupled between the precharge node and ground.

Clause 20. The memory of any of clauses 17-19, wherein the memory is included within a cellular telephone.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A bit line charge sharing precharge circuit, comprising:

a bit line;

a complement bit line a first switch coupled between the bit line and complement bit line;

a power supply node for a memory power supply voltage;

a precharge node;

a second switch coupled between the precharge node and the power supply node;

a third switch coupled between the precharge node and the complement bit line; and a column multiplexer configured to select the bit line and the complement bit line from a group of bit line pairs during a read or write operation.

2. The bit line charge sharing precharge circuit of claim 1, wherein the first switch comprises a first transmission gate.

3. The bit line charge sharing precharge circuit of claim 1, wherein the second switch comprises a first p-type metal-oxide semiconductor (PMOS) transistor having a gate coupled to a node for a precharge sharing signal.

4. The bit line charge sharing precharge circuit of claim 3, wherein the third switch comprises a second PMOS transistor having a gate coupled to the node for the precharge sharing signal.

5. The bit line charge sharing precharge circuit of claim 4, further comprising:

a third PMOS transistor coupled between the precharge node and the bit line and having a gate coupled to the complement bit line.

6. The bit line charge sharing precharge circuit of claim 5, further comprising:

a fourth PMOS transistor coupled between the precharge node and the complement bit line and having a gate coupled to the bit line.

7. The bit line charge sharing precharge circuit of claim 1, wherein the column multiplexer comprises:

a second transmission gate coupled between a node for a write driver input signal and the bit line; and a third transmission gate coupled between a node for a complement write driver input signal and the complement bit line, wherein the second transmission gate and the third transmission gate is each configured to open and close responsive to a column multiplexer signal.

8. The bit line charge sharing precharge circuit of claim 7, wherein the column multiplexer further comprises:

a fifth PMOS transistor coupled between a sense amplifier node and the bit line and having a gate coupled to a node for a read multiplexer signal; and a sixth PMOS transistor coupled between a complement sense amplifier node and the complement bit line and having a gate coupled to the node for a read multiplexer signal.

9. The bit line charge sharing precharge circuit of claim 1, further comprising:

a memory controller configured to close the first switch during a charge sharing period and to close the second switch and the third switch during a precharge period.

10. The bit line charge sharing precharge circuit of claim 1, further comprising:

a capacitor coupled between the precharge node and ground.

11. The bit line charge sharing precharge circuit of claim 10, further comprising:

a fourth switch coupled between the capacitor and the precharge node.

12. The bit line charge sharing precharge circuit of claim 2, wherein the transmission gate comprises a seventh PMOS transistor and an NMOS transistor, coupled in parallel to the seventh PMOS transistor, configured to conduct charge through the transmission gate during a charge sharing period.

13. A method of precharging a pair of bit lines, comprising:

coupling a precharge node to a node for a memory power supply voltage during a first precharge period to precharge the precharge node;

isolating the precharge node from the node for the memory power supply voltage after a completion of the first precharge period;

coupling a bit line to a complement bit line during a charge sharing period following the completion of the first precharge period;

coupling the precharge node to the bit line and to the complement bit line during the charge sharing period; and asserting a voltage of a word line for a word line assertion period to couple a bitcell to the bit line and to the complement bit line following a completion of the charge sharing period.

14. The method of claim 13, wherein coupling the bit line to the complement bit line during the charge sharing period comprises closing a transmission gate coupled between the bit line and the complement bit line.

15. The method of claim 13, further comprising:

coupling the precharge node to the node for a memory power supply voltage during a second precharge period following a completion of the word line assertion period.

16. The method of claim 13, wherein coupling the precharge node to a node for memory supply voltage further comprises charging a capacitor coupled to the precharge node.

17. A memory, comprising:

a bit line;

a complement bit line;

precharge means for precharging a precharge node during a precharge period;

means for coupling the bit line to the complement bit line and to the precharge node during a charge sharing period following the precharge period; and means for selecting the bit line and the complement bit line from a group of bit line pairs during a read or write operation following a completion of the charge sharing period.

18. The memory of claim 17, further comprising:

a first transistor coupled between the precharge node and the bit line and having a gate coupled to the complement bit line; and a second transistor coupled between the precharge node and the complement bit line and having a gate coupled to the bit line.

19. The memory of claim 17, further comprising:

a capacitor coupled between the precharge node and ground.

20. The memory of claim 17, wherein the memory is included within a cellular telephone.

* * * * *